United States Patent
Kono et al.

(10) Patent No.: US 7,947,988 B2
(45) Date of Patent: May 24, 2011

(54) SEMICONDUCTOR DEVICE AND METHOD OF MANUFACTURING THE SAME

(75) Inventors: Hiroshi Kono, Kawasaki (JP); Takashi Shinohe, Yokosuka (JP); Chiharu Ota, Tokyo (JP); Johji Nishio, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 256 days.

(21) Appl. No.: 12/199,848

(22) Filed: Aug. 28, 2008

(65) Prior Publication Data

US 2009/0078942 A1  Mar. 26, 2009

(30) Foreign Application Priority Data

Sep. 20, 2007  (JP) ................................. 2007-244323

(51) Int. Cl.
 *H01L 29/15* (2006.01)
(52) U.S. Cl. ......................................................... 257/77
(58) Field of Classification Search .................. None
 See application file for complete search history.

(56) References Cited

U.S. PATENT DOCUMENTS

| | | | | |
|---|---|---|---|---|
| 5,750,416 | A | 5/1998 | Hshieh et al. | 437/40 |
| 5,786,251 | A | 7/1998 | Harris et al. | 438/268 |
| 6,054,352 | A | 4/2000 | Ueno | 438/268 |
| 6,133,587 | A * | 10/2000 | Takeuchi et al. | 257/77 |
| 6,204,135 | B1 | 3/2001 | Peters et al. | 438/301 |
| 6,246,077 | B1 * | 6/2001 | Kobayashi et al. | 257/77 |
| 2005/0151158 | A1 * | 7/2005 | Kumar et al. | 257/134 |
| 2007/0182014 | A1 * | 8/2007 | Usami et al. | 257/758 |
| 2010/0012951 | A1 * | 1/2010 | Yatsuo et al. | 257/77 |

FOREIGN PATENT DOCUMENTS

| | | |
|---|---|---|
| EP | 1 814 162 A1 | 8/2007 |
| EP | 1 873 838 A1 | 1/2008 |
| JP | 5-243274 | 9/1993 |
| JP | 2006-173584 | 8/2006 |
| JP | 2006-303324 | 11/2006 |

OTHER PUBLICATIONS

Harada, et al., "*Low on-resistance in inversion channel IEMOSFET formed on 4H—SiC C-fafce substrate*", Proceedings of the 18th International Symposium on Power Semiconductor Devices & IC's, Jun. 4-8, 2006, IEEE, 4 pps.

(Continued)

*Primary Examiner* — Charles Garber
*Assistant Examiner* — Andre' C Stevenson
(74) *Attorney, Agent, or Firm* — Ohlandt, Greeley, Ruggiero & Perle, L.L.P.

(57) ABSTRACT

A semiconductor device includes an SiC substrate, a first SiC layer of first conductivity provided on the substrate, a second SiC layer of second conductivity provided on the first SiC layer, first and second SiC regions provided in the second SiC layer, facing each other and having the same depth, a third SiC region extending through the first SiC region and reaching the first SiC layer, a gate insulator formed on the first and second SiC regions and the second SiC layer interposed therebetween, a gate electrode formed on the gate insulator, a first contact of first conductivity formed on the second SiC region, a second contact of second conductivity formed on the second SiC region, reaching the second SiC layer through the second SiC region, and a top electrode formed on the first and second contacts, and a bottom electrode formed on a back surface of the substrate.

17 Claims, 5 Drawing Sheets

OTHER PUBLICATIONS

Kosugi, et al., "*Fabrication of double implanted (0001) 4H—SiC MOSFETs by using pyrogenic re-oxidation annealing*"; Materials Science Forum, vols. 457-460, 2004, pp. 1397-1400.

Office Action dated Mar. 2, 2010 from corresponding JP 2007-244323.

Office Action dated Jun. 2, 2009 from corresponding EP 08014432.2.

* cited by examiner

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2007-244323, filed Sep. 20, 2007, the entire contents of which are incorporated herein by reference.

BACKGROUND OF THE INVENTION

1. Field of the Invention

The present invention relates to a high-voltage semiconductor device using silicon carbide (SiC).

2. Description of the Related Art

SiC is expected to be the material of power semiconductor devices of the next generation. SiC exhibits excellent physical properties. Its band gap is three times as large as that of Si, its breakdown field strength is about ten times as high as that of Si, and its thermal conductivity is approximately three times as high as that of Si. Having such desirable physical properties, SiC can help to provide power semiconductor devices that operate at a very small loss and at high temperatures.

Various high-voltage semiconductor devices are available, which utilize the physical properties of SiC. Known as such a semiconductor device is double implantation MOSFET (hereinafter referred to as DIMOSFET (see, for example, R. Kosugi et al., Materials Science Forum, Vols. 457-460 (2004), pp. 1397-1400). The DIMOSFET is a device easy to manufacture because its channel can be formed by ion implantation in the planer process. Further, the DIMOSFET is can be driven by a small-power drive circuit, because its gate is voltage-controlled. In view of this, the DIMOSFET is a desirable device fit to parallel operation.

However, the self-align process performed by means of thermal diffusion in manufacturing Si devices cannot be employed in order to manufacture SiC devices. Therefore, to form the channel region of a SiCMOSFET, the base and source regions are independently formed by ion implantation, using two masks. The resistance in the channel region must be lowered in order to decrease the on-resistance of MOSFET. To this end, the channel length should be reduced to about 0.5 μm. Here arises a problem. If a channel 0.5 μm long is formed by ion implantation using two masks, the channel resistance will change by 20% from the design value even if the alignment error is only 0.1 μm. This hinders the miniaturization of SiCMOSFETs.

As described above, the base region and source region of the conventional DIMOSFET are independently formed by ion implantation that uses two masks. The channel length is determined by the distance between an edge of the base region and that edge of the source region which opposes that edge of the base region. Inevitably, the channel length deviates from the design value due to an error made in aligning the ion-implantation masks. Consequently, the device will have an on-resistance that differs from the design value. This hinders the miniaturization of the device.

Accordingly, it is demanded that a SiC semiconductor device of a very low on-resistance, which can be manufactured without errors in aligning the ion-implantation masks and can therefore has a short channel, is realized.

BRIEF SUMMARY OF THE INVENTION

According to a first aspect of the invention, there is provided a semiconductor device, which includes:

a silicon carbide substrate having a first major surface and a second major surface;

a first silicon carbide layer of a first conductivity type provided on the first major surface of the silicon carbide substrate;

a second silicon carbide layer of a second conductivity type provided on the first silicon carbide layer;

a first silicon carbide region and a second silicon carbide region provided in a surface region of the second silicon carbide layer, opposed to each other and spaced apart by a prescribed distance, and having the same depth;

a third silicon carbide region extending through the first silicon carbide region and reaching the first silicon carbide layer;

a gate insulating film formed on the first silicon carbide region, the second silicon carbide region and that part of the second silicon carbide layer which lies between the first silicon carbide region and the second silicon carbide region;

a gate electrode formed on the gate insulating film;

a first contact region of the first conductivity type formed on a surface of the second silicon carbide region;

a second contact region of the second conductivity type formed on a surface of the second silicon carbide region, reaching the second silicon carbide layer through the second silicon carbide region;

a first main electrode formed on the first contact region and the second contact region; and a second main electrode formed on the second major surface of the silicon carbide substrate.

According to a second aspect of the invention, there is provided a method of manufacturing a semiconductor device, which includes:

forming a first silicon carbide layer of a first conductivity type, in a first major surface of a silicon carbide substrate;

forming a second silicon carbide layer of a second conductivity type, on the first silicon carbide layer;

forming an ion-implantation mask on an upper surface of the second silicon carbide layer; implanting ions of first conductivity type impurities into the second silicon carbide layer by using the ion-implantation mask, thereby forming a first silicon carbide region and a second silicon carbide region;

forming a third silicon carbide region of the first conductivity type extending through the first silicon carbide region and connected to the first silicon carbide layer;

forming a first contact region of the first conductivity type, in a surface region of the second silicon carbide region;

forming a second contact region of the second conductivity type in the second silicon carbide region, the second contact region extending through the second silicon carbide region and being connected to the second silicon carbide layer;

forming a gate insulating film on the first silicon carbide region and the second silicon carbide region and on the second silicon carbide layer which lies between the first silicon carbide region and the second silicon carbide region;

forming a gate electrode on the gate insulating film;

forming a first main electrode on the first contact region and the second contact region; and forming a second main electrode on a second major surface of the silicon carbide substrate.

DETAILED DESCRIPTION OF THE INVENTION

Embodiments of this invention, which will be described below, can provide SiC semiconductor devices that have a short channel because no mask alignment errors accompany the ion implantation, and therefore have a very low on-resistance.

With reference to the accompanying drawings, the embodiments will be described. The following description is based on the assumption that the first and second conductivity types are n type and p type, respectively. Nonetheless, the conductivity types may be other way around.

First Embodiment

Figure 1:
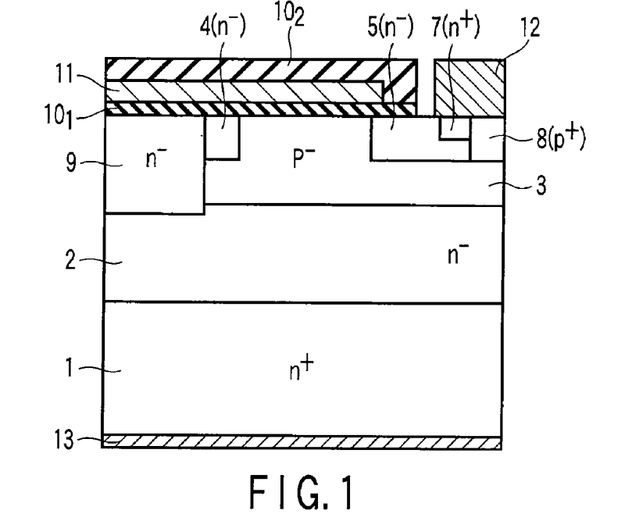
FIG. 1 is a sectional view of a vertical SiCMOSFET according to a first embodiment of the present invention.

FIG. 1 is a sectional view of a vertical SiCMOSFET according to a first embodiment of this invention. As FIG. 1 shows, a first silicon carbide layer (n$^-$-type drift layer) 2 containing n-type impurities at concentration of about $5\times10^{15}$ to $2\times10^{16}$/cm$^3$ and thickness of about 5 to 10 μm is formed on a hexagonal-crystal SiC substrate (n$^+$-type substrate) 1 that contains n-type impurities at concentration of about $5\times10^{18}$ to $1\times10^{19}$/cm$^3$. On the surface of the n$^-$ drift layer 2, a second silicon carbide layer (p-type base region) 3 containing p-type impurities at concentration of about $1\times10^{17}$ to $5\times10^{17}$/cm$^3$ is formed to thickness of 0.6 μm by means of epitaxial growth.

Further, a first silicon carbide region 4 of n$^-$-type and a second silicon carbide region (n$^-$-type source region) 5 are formed in the p-type base region 3 (to the same depth of, for example, 0.3 μm from the surface of the p-type base region 3).

An n$^+$-type source contact 7 is formed in the surface of the source region 5. Adjacent to the n$^+$-type source contact 7, a p$^+$-type contact region 8 containing p-type impurities at concentration of about $1\times10^{20}$/cm$^3$ is formed, connected to the p-type base region 3. On the n$^+$-type source contact 7 and p$^+$-type contact region 8, a source electrode 12 made of, for example, Ni is formed.

On the surface of the first silicon carbide layer (n$^-$-type drift layer) 2 and adjacent to the second silicon carbide layer (p-type base region) 3 and first silicon carbide region 4, an n$^-$-type third silicon carbide region 9 is formed in flush with the second silicon carbide layer (p-type base region) 3 and first silicon carbide region 4.

On the surface of the p-type base region 3, and the first and second silicon carbide regions 4 and 5, a gate insulating film 10$_1$ about 80 nm thick is formed, covering the above regions 3, 4 and 5. The gate insulating film 10$_1$ need not cover the entire surface of the first silicon carbide region 4. On the gate insulating film 10$_1$, a gate electrode 11 made of polycrystalline silicon is formed. The gate electrode 11 is covered with a silicon oxide film 10$_2$. In the structure of FIG. 1, the first silicon carbide region 4 and second silicon carbide region (n$^-$-type source region) 5 have been formed on the second silicon carbide layer (p-type base region) 3 by means of ion implantation. Thus, the distance between the regions 4 and 5 defines the channel length. Since the ion implantation is performed, using one mask as will be explained later, mask-alignment errors, which would otherwise arise, will not arise at all.

Figure 2:
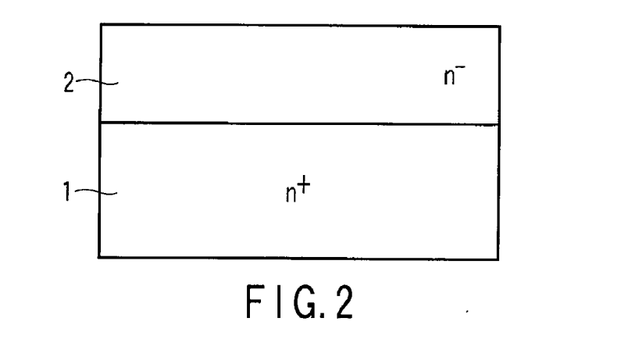
FIGS. 2 to 6 are sectional views explaining a method of manufacturing the SiCMOSFET according to the first embodiment.

A method of manufacturing the first embodiment will be explained with reference to FIGS. 2 to 6. First, as shown in FIG. 2, a first silicon carbide layer (n$^-$-type drift layer) 2 containing n-type impurities (e.g., nitrogen, N) at concentration of about $5\times10^{15}$/cm$^3$ is formed to thickness of about 10 μm by epitaxial growth, on an n$^+$-type 4HSiC substrate 1 containing n-type impurities (nitrogen, N) at concentration of about $5\times10^{19}$/cm$^3$ and having thickness of 300 μm. The thickness and impurity concentration of the epitaxial layer have been determined by the design breakdown voltage of the device. The device according to the first embodiment withstands 1200V. Nitrogen is used as n-type impurity. The n-type impurity may be any other one, e.g., phosphorus (P) or the like. Nitrogen and phosphorus can be used together.

Figure 3:
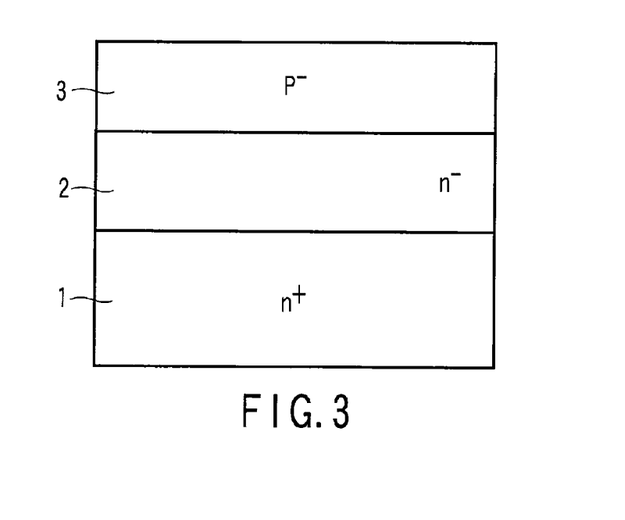

Next, as shown in FIG. 3, a second silicon carbide layer 3 containing p-type impurities (e.g., Al) at concentration of about $1\times10^{17}$ to $5\times10^{17}$/cm$^3$ is formed to thickness of 0.6 μm on the surface of the n$^-$ drift layer 2, by means of epitaxial growth.

Figure 4:
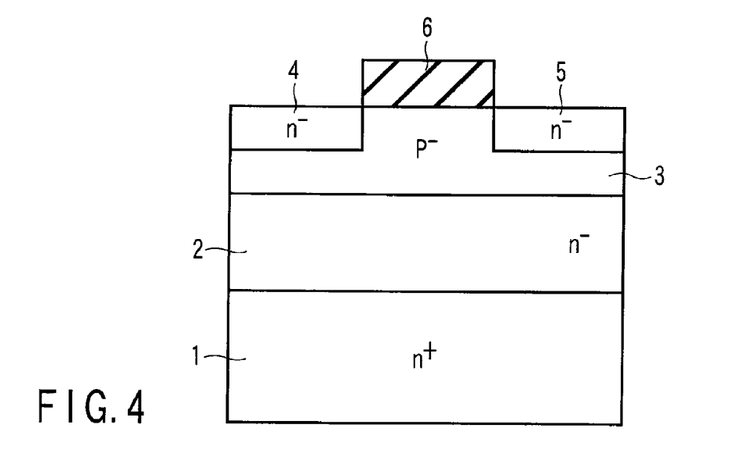

As shown in FIG. 4, an ion-implantation mask 6 is formed on the second silicon carbide layer 3. Ions of n-type impurity (e.g., phosphorus, P) are implanted into the second silicon carbide layer 3 at acceleration energy of 10 to 250 keV and dose of $1\times10^{14}$/cm$^2$. A first silicon carbide region 4 and a second silicon carbide region (n$^-$-type source region) 5 are thereby formed to the depth of 0.3 μm from the surface of the second silicon carbide layer 3.

Figure 5:
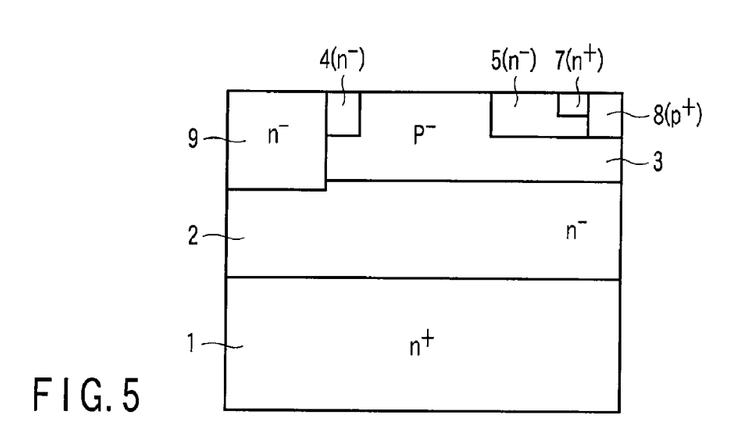

Then, as shown in FIG. 5, an n$^+$-type source contact 7 is formed in a selected surface region of the source region 5. The n$^+$-type source contact 7 has an impurity concentration of $1\times10^{20}$/cm$^3$. Further, ions are implanted, reaching the second silicon carbide layer 3 through the source region 5, forming a p$^+$-type contact 7. The p$^+$-type contact 7 need not be formed in the source region 5, because it only need be connected to the second silicon carbide layer 3. Still further, an n$^-$-type third silicon carbide region 9 is formed by ion implantation, extending to the first silicon carbide layer 2 through the second silicon carbide layer 3. Thereafter, the resultant structure is subjected to heat treatment at about 1600° C., activating the impurities injected.

Figure 6:
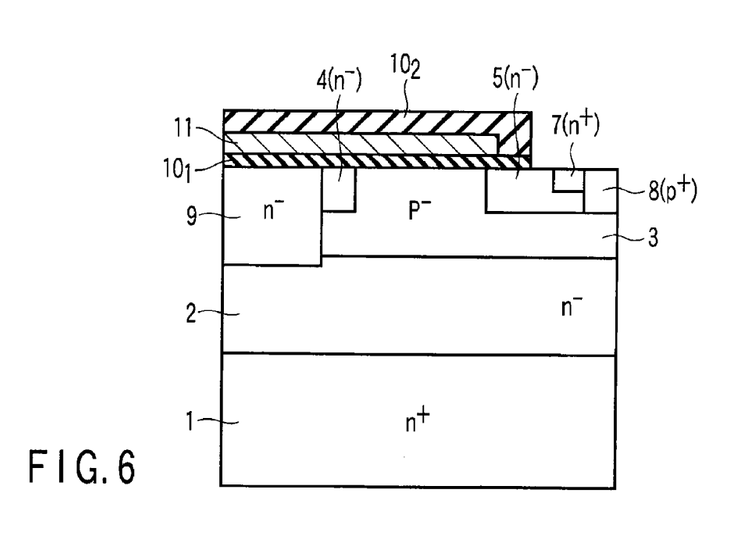

Next, a gate insulating film 10$_1$ is formed by thermal oxidation or CVD, over the n$^-$-type third silicon carbide region 9, first silicon carbide region 4, base region 3 and source region 5 as shown in FIG. 6. On the gate insulating film 10$_1$, a polycrystalline silicon layer is formed by means of CVD. The polycrystalline silicon layer is then patterned by lithography and RIE, providing a gate electrode 11. Thereafter, surface oxidation or CVD is performed, forming a silicon oxide film 10$_2$, which covers the gate electrode 11.

Then, the entire surface of the silicon carbide substrate 1 is covered with resist (not shown). Diluted or buffered hydrofluoric acid (HF) is applied to the lower surface of the silicon carbide substrate 1, thus removing a thin oxide film therefrom. Ni film is then vapor-deposited on the lower surface of the silicon carbide substrate 1, forming a drain electrode (second main electrode) 13. Thereafter, a source electrode (first main electrode) 12, i.e., an Ni film, is formed on selected parts of the source contact 7 and p$^+$ contact 8 by means of vapor deposition and lift-off process. Finally, the resultant structure is sintered at 950° C. for about five minutes, improving the ohmic contact between the source electrode 12 and the drain electrode 13. Thus, a vertical SiCMOSFET shown in FIG. 1 is manufactured.

In the first embodiment, the channel region lies between those edges of the first silicon carbide region 4 and second silicon carbide region (source region) 5, which oppose each other. Hence, the channel lies on the epitaxial layer 3. This achieves high channel mobility.

Modifications of the first embodiment will be described.
(First Modification)

In the first modification of FIG. 3, the second silicon carbide layer 3 is an epitaxial layer. The layer 3 may be formed by ion implantation, instead. In this case, Al, for example, is ion-implanted from the upper surface of the first silicon carbide layer 2 at acceleration energy of 400 keV and dose of $1\times10^{14}/cm^2$.

(Second Modification)

When the third silicon carbide region 9 is formed by ion implantation, as shown in FIG. 5 of the first embodiment, the ion implantation is controlled such that the region 9 may have the lower concentration as the part thereof comes lower. At this point, the maximum acceleration energy is of such a value that the ions can penetrate the second silicon carbide layer 3, i.e., epitaxial layer. More precisely, multi-stage ion implantation is performed at the maximum energy of, for example, 400 keV, at 500° C. As a result, there is formed the region 9 having impurity concentration gradually decreasing in the depth direction, e.g., from $2\times10^{16}/cm^3$ to $5\times10^{15}/cm^3$. Since the ion implantation is so performed, the depletion layer easily expands into the lower corners of the third silicon carbide region 9. This can reduce the intensity of the electric field at the lower corners of the third silicon carbide region 9, and can ultimately increase the breakdown voltage of the device.

(Third Modification)

Figure 7:
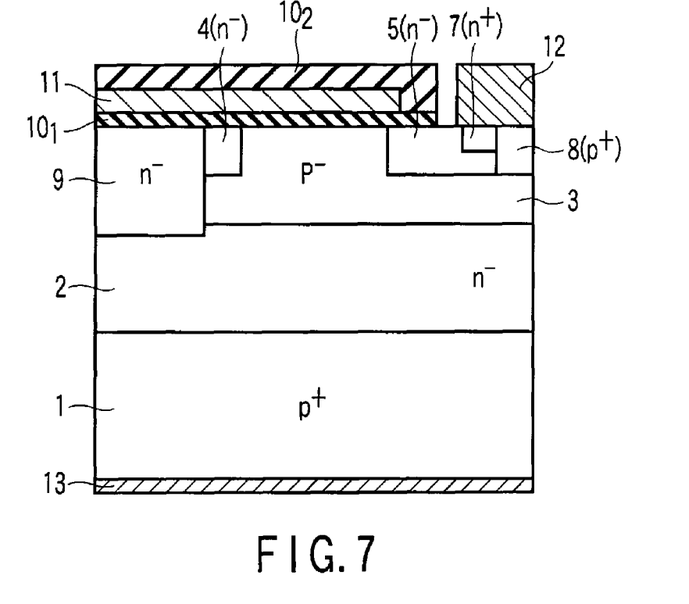
FIG. 7 is a sectional view of an IGBT according to a modification of the first embodiment.
Figure 8:
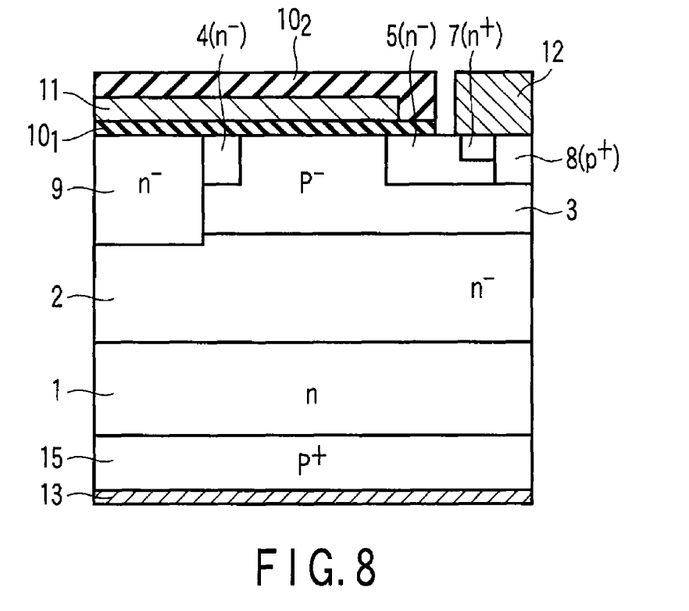
FIG. 8 is a sectional view of an IGBT according to another modification of the first embodiment.

If the silicon carbide substrate 1 of the first embodiment is $p^+$-type, an IGBT (see FIG. 7) may be formed on the substrate. In this case, the second silicon carbide region 5 is the emitter region, the source electrode 12 is the emitter electrode, and the drain electrode 13 is the collector electrode. Further, the p-type collector layer 15 may be formed in another way, by implanting first n-type impurity ions first and then p-type impurity ions, into the $n^-$-type silicon carbide substrate 1 from the lower surface thereof as shown in FIG. 8.

As has been described above, in the first embodiment, the first silicon carbide region and source region can be formed at the same time because one mask is used. Since only one mask is used, no mask-alignment errors occur at all. Therefore, the cannel length, which is defined by the mask, can be short and small. As a result, the device can have a very low on-resistance.

Second Embodiment

Figure 9:
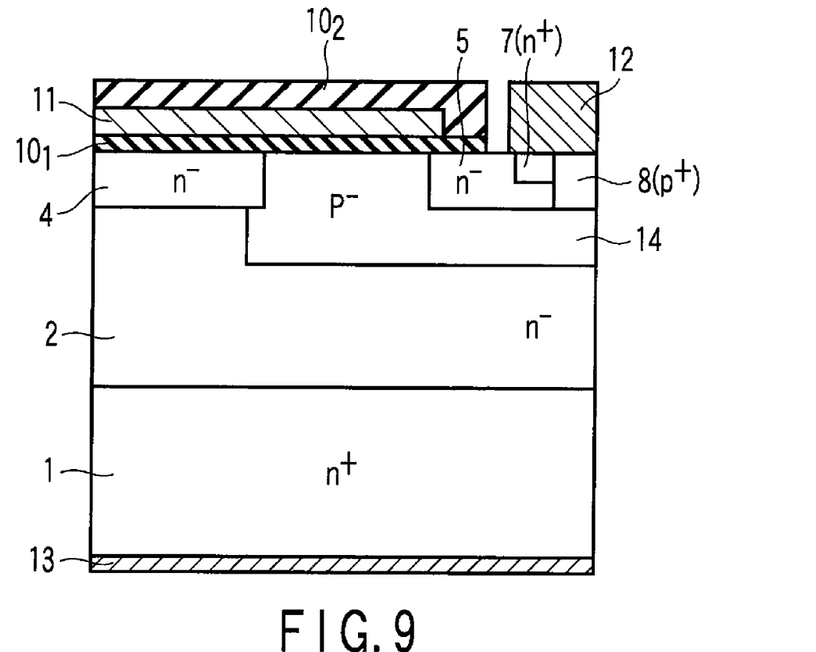
FIG. 9 is a sectional view of a vertical SiCMOSFET according to a second embodiment of the present invention.

FIG. 9 is a sectional view of a vertical SiCMOSFET according to a second embodiment of the present invention. The components identical to those of the first embodiment are designated by the same reference numbers and will not be described. The second embodiment differs from the first embodiment in two respects. First, a $p^-$-type well 14 is provided in place of the $p^-$-type base region. Second, first silicon carbide region 4 covers the projecting part of the first silicon carbide layer 2, too, which lies adjacent to the $p^-$-type well 14.

Figure 10:
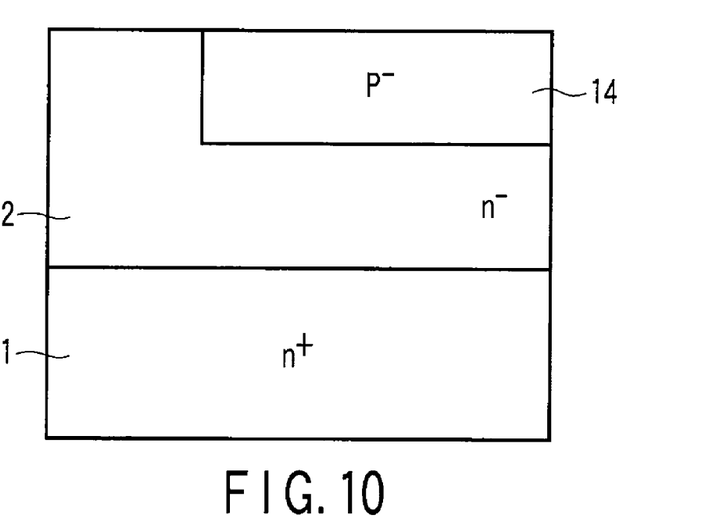
FIGS. 10 to 12 are sectional views explaining a method of manufacturing the SiCMOSFET according to the second embodiment.

A method of manufacturing the second embodiment will be explained with reference to FIGS. 10 to 12. As shown in FIG. 10, a first silicon carbide layer ($n^-$-type drift layer) 2 containing n-type impurities (e.g., nitrogen, N) at concentration of about $5\times10^{15}/cm^3$ is formed to thickness of about 10 µm by epitaxial growth, on an $n^+$-type 4HSiC substrate 1 (having impurity concentration of about $5\times10^{18}$ to $1\times10^{19}/cm^3$), as in the first embodiment. The thickness and impurity concentration of the epitaxial layer have been determined by the design breakdown voltage of the device.

Next, a silicon oxide film (not shown) is formed on the surface of the first silicon carbide layer 2. Resist (not shown) is spin-coated on the silicon oxide film thus formed. The resist is patterned by means of photolithography, providing a resist pattern. Using this resist pattern as etching mask, anisotropic etching such as RIE is performed on the silicon oxide film (not shown), forming an ion-implantation mask (not shown). Using the ion-implantation mask, p-type impurities (e.g., Al) are implanted into the first silicon carbide layer 2 by means of selective ion implantation. Al ions are implanted at 500° C. at acceleration energy of 400 keV and dose of $1\times10^{14}/cm^2$. As a result, a base region 14 containing p-type impurities is formed as shown in FIG. 10, to the depth of 0.6 µm from the surface of the first silicon carbide layer 2.

Figure 11:
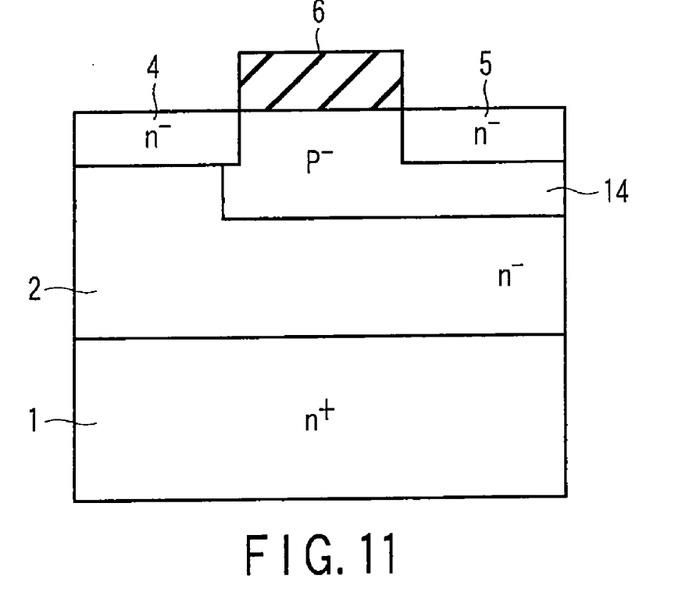

Then, as shown in FIG. 11, an ion-implantation mask 6, such as a silicon oxide film, is formed on the first silicon carbide layer 2. While maintaining the substrate at temperature of about 500° C., n-type impurities (e.g., phosphorus, P) are ion-implanted at acceleration energy of 10 to 250 keV and total dose of $1\times10^{14}/cm^2$. First silicon carbide region 4 and second silicon carbide region (source region) 5 are thereby formed to the depth of 0.3 µm from the surface of the first silicon carbide layer 2. At this point, the edge of the ion-implantation mask 6 should align with the edge of the p-type base region 14 formed in the first silicon carbide layer 2 or should be placed inside the p-type base region 14.

Figure 12:
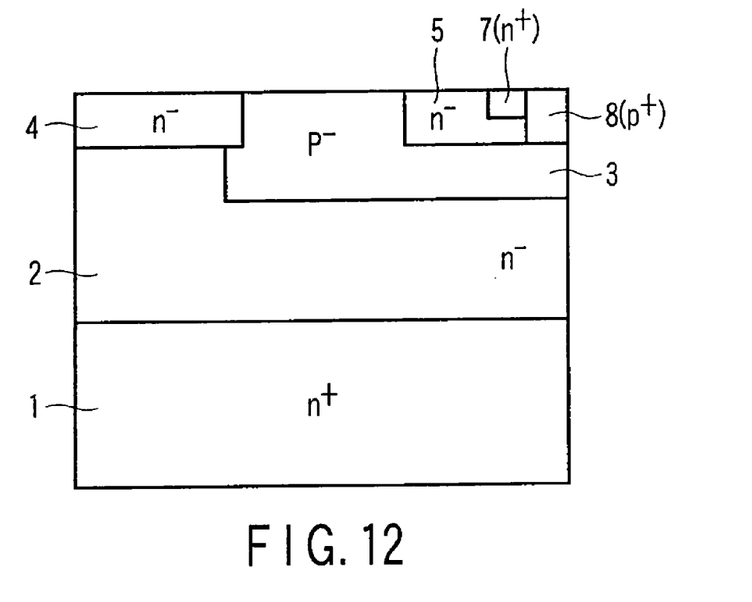

Next, as shown in FIG. 12, an $n^+$-type source contact region 7 having an impurity concentration of $1\times10^{20}/cm^3$ is formed in a selected surface region of the source region 5. Further, impurity ions are implanted through the source region 5, reaching the base region 3, forming a $p^+$-type contact 8 provided in the source region 5 and located adjacent to the source contact region 7. Thereafter, the resultant structure is subjected to heat treatment at about 1600° C., activating the impurities injected.

Thereafter, as in the first embodiment, a gate insulating film $10_1$ is formed by thermal oxidation or CVD, over the first silicon carbide region 4, base region 3 and source region 5. On the gate insulating film $10_1$, a polycrystalline silicon layer is formed by means of CVD. The polycrystalline silicon layer is then patterned by lithography or RIE, providing a gate electrode 11. Thereafter, surface oxidation or CVD is performed, forming a silicon oxide film $10_2$, which covers the gate electrode 11.

Then, the entire surface of the silicon carbide substrate 1 is covered with resist (not shown). Diluted or buffered hydrofluoric acid (HF) is applied to the lower surface of the silicon carbide substrate 1, thus removing a thin oxide film therefrom. Ni film is then vapor-deposited on the lower surface of the silicon carbide substrate 1, forming a drain electrode (second main electrode) 13. Thereafter, a source electrode 12, i.e., an Ni film, is formed on selected parts of the source contact 7 and $p^+$ contact 8 by means of vapor deposition and lift-off process. Finally, the resultant structure is sintered at 950° C. for about five minutes, improving the ohmic contact between the source electrode 12 and the drain electrode 13. Thus, a vertical SiCMOSFET shown in FIG. 1 is manufactured. In the second embodiment, too, the distance between the first silicon carbide region 4 and the second silicon carbide region (source region) 5 defines the channel length.

Also in the second embodiment, the first carbide silicon region and the second carbide silicon region (source region) are formed at the same time. Since the channel length of the device is determined by the mask used to form the first and second first carbide silicon regions, mask-alignment errors, which would otherwise arise, will not arise at all. Hence, the device can have a short channel, which greatly reduces the on-resistance of the device. In the second embodiment, a component equivalent to the third silicon carbide region 9 used in the first embodiment need not be formed. This simplifies the method of manufacturing the device according to the second embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a silicon carbide substrate having a first major surface and a second major surface;
    a first silicon carbide layer of a first conductivity type provided on the first major surface of the silicon carbide substrate;
    a second silicon carbide layer of a second conductivity type provided on the first silicon carbide layer;
    a first silicon carbide region and a second silicon carbide region provided in a surface region of the second silicon carbide layer, opposed to each other and spaced apart by a prescribed distance, and having the same depth;
    a third silicon carbide region of the first conductivity type extending through the first silicon carbide region and reaching the first silicon carbide layer;
    a gate insulating film formed on the first silicon carbide region, the second silicon carbide region and that part of the second silicon carbide layer which lies between the first silicon carbide region and the second silicon carbide region;
    a gate electrode formed on the gate insulating film;
    a first contact region of the first conductivity type formed on a surface of the second silicon carbide region;
    a second contact region of the second conductivity type formed on a surface of the second silicon carbide region, reaching the second silicon carbide layer through the second silicon carbide region;
    a first main electrode formed on the first contact region and the second contact region; and
    a second main electrode formed on the second major surface of the silicon carbide substrate.

2. The semiconductor device according to claim 1, wherein the third silicon carbide region has an impurity concentration which gradually decreases in a direction from the first major surface toward the second major surface.

3. The semiconductor device according to claim 1, wherein the silicon carbide substrate is of the first conductivity type to constitute an MOSFET.

4. The semiconductor device according to claim 1, wherein the silicon carbide substrate is of the second conductivity type to constitute an IGBT.

5. A semiconductor device comprising:
    a silicon carbide substrate having a first major surface and a second major surface;
    a first silicon carbide layer of a first conductivity type provided on the first major surface of the silicon carbide substrate and having a projecting part on an upper surface the first silicon carbide layer;
    a first silicon carbide region of a second conductivity type formed on the first silicon carbide layer, except the projecting part;
    a second silicon carbide region of the first conductivity type provided on the projecting part of the first silicon carbide layer, in flush with the first silicon carbide region, and protruding laterally in part toward the first silicon carbide region;
    a third silicon carbide region of the first conductivity type provided in a surface region of the first silicon carbide region, opposed to the second silicon carbide region and spaced therefrom by a prescribed distance, and having the same impurity concentration and the same depth as the second silicon carbide region;
    a gate insulating film formed on surfaces of the second silicon carbide region, the third silicon carbide region and on that surface of the first silicon carbide region, which lies between the second silicon carbide region and the third silicon carbide region;
    a gate electrode formed on the gate insulating film;
    a first contact region of the first conductivity type formed in a surface region of the third silicon carbide region;
    a second contact region of the second conductivity type formed in a surface region of the third silicon carbide region;
    a first main electrode formed on the first contact region and the second contact region; and
    a second main electrode formed on the second major surface of the silicon carbide substrate.

6. The semiconductor device according to claim 5, wherein the silicon carbide substrate is of the first conductivity type to constitute an MOSFET.

7. The semiconductor device according to claim 5, wherein the silicon carbide substrate is of the second conductivity type to constitute an IGBT.

8. A method of manufacturing a semiconductor device, comprising:
    forming a first silicon carbide layer of a first conductivity type, in a first major surface of a silicon carbide substrate;
    forming a second silicon carbide layer of a second conductivity type, on the first silicon carbide layer;
    forming an ion-implantation mask on an upper surface of the second silicon carbide layer;
    implanting ions of first conductivity type impurities into the second silicon carbide layer by using the ion-implantation mask, thereby forming a first silicon carbide region and a second silicon carbide region;
    forming a third silicon carbide region of the first conductivity type extending through the first silicon carbide region and connected to the first silicon carbide layer;
    forming a first contact region of the first conductivity type, in a surface region of the second silicon carbide region;
    forming a second contact region of the second conductivity type in the second silicon carbide region, the second contact region extending through the second silicon carbide region and being connected to the second silicon carbide layer;
    forming a gate insulating film on the first silicon carbide region and the second silicon carbide region and on the second silicon carbide layer which lies between the first silicon carbide region and the second silicon carbide region;
    forming a gate electrode on the gate insulating film;

forming a first main electrode on the first contact region and the second contact region; and forming a second main electrode on a second major surface of the silicon carbide substrate.

9. The method according to claim 8, wherein the third silicon carbide region is formed to have an impurity concentration which gradually decreases in a direction from the first major surface toward the second major surface.

10. The method according to claim 8, wherein the first silicon carbide region and the second silicon carbide region are formed to contain the same impurity, to have the same impurity concentration and to have the same depth.

11. The method according to claim 8, wherein the silicon carbide substrate is of the first conductivity type to constitute an MOSFET.

12. The method according to claim 8, the silicon carbide substrate is of the second conductivity type to constitute an IGBT.

13. A method of manufacturing a semiconductor device, comprising:

forming a first silicon carbide layer of a first conductivity type, on a first major surface of a silicon carbide substrate;

forming a buried silicon carbide region of a second conductivity type, on a selected upper surface part of the first silicon carbide layer;

forming an ion-implantation mask on an upper surface of the buried silicon carbide region;

implanting ions of first conductivity type impurities by using the ion-implantation mask, thereby forming a first silicon carbide region in an upper surface region of the first silicon carbide layer and in an upper surface region of the buried silicon carbide region which lies adjacent to the first silicon carbide layer, and forming a second silicon carbide region in an upper surface region of the buried silicon carbide region;

forming a first contact region of the first conductivity type and a second contact region of the second conductivity type in the second silicon carbide region, the second contact region being connected to the second silicon carbide layer;

forming a gate insulating film on the first silicon carbide region and the second silicon carbide region and on that part of the buried silicon carbide region which lies between the first silicon carbide region and second silicon carbide region;

forming a gate electrode on the gate insulating film;

forming a first main electrode on the first contact region and second contact region; and forming a second main electrode on a second major surface of the silicon carbide substrate.

14. The method according to claim 13, wherein the first silicon carbide region and the second silicon carbide region are formed such that the first silicon carbide region protrudes laterally into the second silicon carbide layer and is opposed to the second silicon carbide region.

15. The method according to claim 13, wherein the first silicon carbide region and the second silicon carbide region are formed to contain the same impurity, to have the same impurity concentration and to have the same depth.

16. The method according to claim 13, wherein the silicon carbide substrate is of the first conductivity type to constitute an MOSFET.

17. The method according to claim 13, the silicon carbide substrate is of the second conductivity type to constitute an IGBT.

* * * * *